(12) United States Patent
Böhm et al.

(10) Patent No.: US 6,480,055 B2
(45) Date of Patent: Nov. 12, 2002

(54) DECODER ELEMENT FOR GENERATING AN OUTPUT SIGNAL HAVING THREE DIFFERENT POTENTIALS AND AN OPERATING METHOD FOR THE DECODER ELEMENT

(75) Inventors: Thomas Böhm, Zorneding (DE); Georg Braun, München (DE); Heinz Hönigschmid, East Fishkill, NY (US); Zoltan Manyoki, Kanata (CA); Ernst Neuhold, Graz (AT); Thomas Röhr, Aschheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/822,028

(22) Filed: Mar. 29, 2001

(65) Prior Publication Data

US 2002/0008564 A1 Jan. 24, 2002

Related U.S. Application Data

(63) Continuation of application No. PCT/DE99/02321, filed on Jul. 28, 1999.

(30) Foreign Application Priority Data

Sep. 29, 1998 (DE) .......................................... 198 44 666

(51) Int. Cl.$^7$ ................................................ H03K 17/76
(52) U.S. Cl. ........................ 327/416; 326/108; 341/57
(58) Field of Search ................................. 327/415–417; 326/104–108; 341/56, 57; 365/230.06, 230.07

(56) References Cited

U.S. PATENT DOCUMENTS 6,172,531 B1 * 1/2001 Aipperspach et al. ........ 326/108

FOREIGN PATENT DOCUMENTS

EP 0 352 937 A2 1/1990

\* cited by examiner

Primary Examiner—Kenneth B. Wells
(74) Attorney, Agent, or Firm—Laurence A. Greenberg; Werner H. Stemer; Ralph E. Locher

(57) ABSTRACT

A decoder element is provided with an output, whereby an output signal with one of three different possible potentials is produced. The output signal may have a value of either a first potential, a second potential, and a third potential, where the second potential lies between the first potential and the third potential. The output signal is produced according to voltage values of input signals at terminal connections of the decoder element.

5 Claims, 2 Drawing Sheets

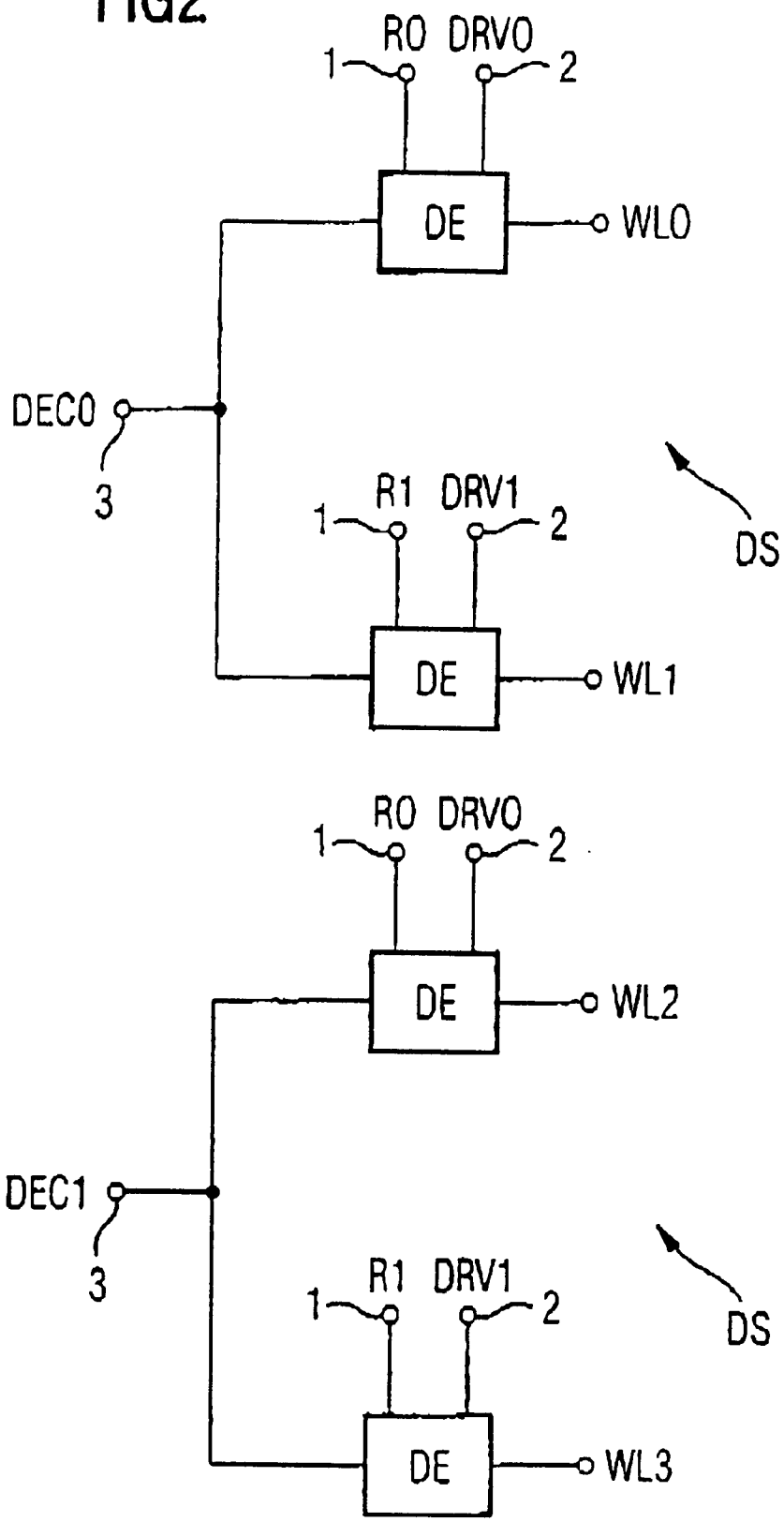

DECODER ELEMENT FOR GENERATING AN OUTPUT SIGNAL HAVING THREE DIFFERENT POTENTIALS AND AN OPERATING METHOD FOR THE DECODER ELEMENT

CROSS-REFERENCE TO RELATED APPLICATION

This application is a continuation of International Application No. PCT/DE99/02321, filed Jul. 28, 1999, which designated the United States.

BACKGROUND OF THE INVENTION

Field of the Invention

The invention relates to a decoder element for generating an output signal having three different potentials, and an operating method for the decoder element.

SUMMARY OF THE INVENTION

It is accordingly an object of the invention to provide a decoder element for generating an output signal having three different potentials and an operating method for the decoder element which overcomes the above-mentioned disadvantages of the prior art devices and methods of this general type, which generates, at an output, an output signal which can assume three different potentials as a function of input signals of the decoder element.

With the foregoing and other objects in view there is provided, in accordance with the invention, a decoder element containing an output outputting an output signal having one of three different potentials including a first potential, a second potential, and a third potential. The second potential lies between the first potential and the third potential. A first terminal and a potential terminal having a value of the second potential impressed thereon are provided. A first series circuit is provided and is formed of a first transistor of a first conductivity type and a second transistor of a second conductivity type connected in series with each other and connected to the first terminal. The second transistor has a control terminal connected to the potential terminal, and the first transistor has a control terminal. The first terminal is connected to the output through the first series circuit. A third transistor of the first conductivity type having a control terminal and connected between a second terminal and the output is provided. A fourth transistor of the second conductivity type connected between the output and the potential terminal is provided and has a control terminal. A third terminal is connected to the control terminal of the third transistor and to the control terminal of the fourth transistor. A fifth transistor of the first conductivity type having a control terminal is provided. The fifth transistor is connected to the control terminal of the first transistor and to the third terminal such that the third terminal is connected to the control terminal of the first transistor through the fifth transistor. Finally, the decoder element has a sixth transistor of the second conductivity type with a control terminal, a first connection connected to the potential terminal, and a second connection connected to the control terminal of the first transistor such that the control terminal of the first transistor can be connected to the potential terminal through the sixth transistor. The second terminal is connected to the control terminal of the fifth transistor and to the control terminal of the sixth transistor.

In accordance with an added feature of the invention, in order to generate the output signal having a value of the second potential, the first potential or the second potential is present at the first terminal, and the third potential is present at both the second terminal and the third terminal.

In accordance with an additional feature of the invention, in order to generate the output signal having a value of the third potential, the first potential or the second potential is present at the first terminal, the third potential is present at the second terminal and the first potential is present at the third terminal.

With the foregoing and other objects in view there is further provided, in accordance with the invention, a decoder circuit formed of first and second decoder elements as described above. The third terminal of the first decoder element is connected to the third terminal of the second decoder element.

With the foregoing and other objects in view there is further provided, in accordance with the invention, a method for operating decoder elements, which includes providing a decoder element as described above. The output signal having the first potential is generated by applying the first potential to the second terminal. A change-over from the third potential to the first potential is then impressed on the third terminal, and subsequently a change-over from the second potential to the first potential is impressed on the first terminal.

Other features which are considered as characteristic for the invention are set forth in the appended claims.

Although the invention is illustrated and described herein as embodied in a decoder element for generating an output signal having three different potentials and an operating method for the decoder element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a block diagram of an exemplary embodiment of a decoder circuit with two decoder elements as shown in FIG. 1.

DESCRIPTION OF THE PREFERRED EMBODIMENTS

Figure 1:
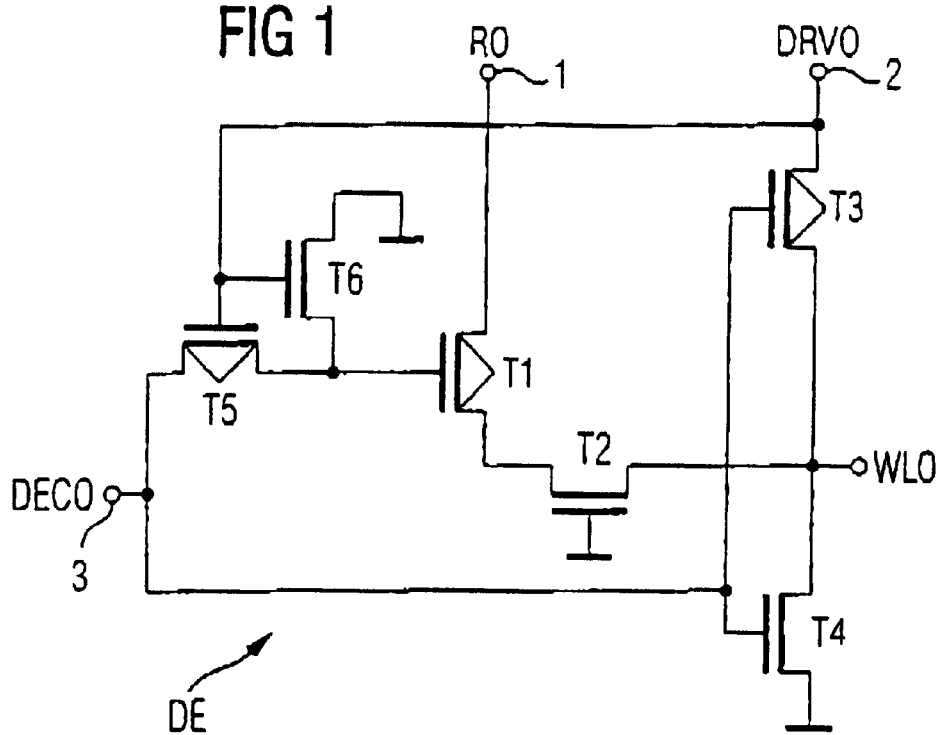
FIG. 1 is a schematic diagram of an exemplary embodiment of a decoder element according to the invention.

In all the figures of the drawing, sub-features and integral parts that correspond to one another bear the same reference symbol in each case. Referring now to the figures of the drawing in detail and first, particularly, to FIG. 1 thereof, there is shown a decoder element DE according to the invention. A first series circuit composed of a transistor T1 of a p-channel type and a second transistor T2 of an n-channel type is disposed between a first terminal 1 and an output WL0. A gate of the second transistor T2 is connected to ground (0 volts). In addition, a second series circuit composed of a third transistor T3 of the p-channel type and of a fourth transistor 4 of the n-channel type is disposed between a second terminal 2 and ground. The drains of the third transistor T3 and fourth transistor T4 are connected to the output WL0. A third terminal 3 is connected to a gate of the third transistor T3 and of the fourth transistor T4. In addition, the third terminal 3 is connected to a gate of the first transistor T1 through a fifth transistor T5 of the p-channel type. The gate of the first transistor T1 is also connected to ground through a sixth transistor T6 of the n-channel type. The gates of the fifth transistor T5 and sixth transistor T6 are connected to the second terminal 2. The function of the decoder element DE in FIG. 1 will be explained below with reference to FIG. 3.

Figure 3:
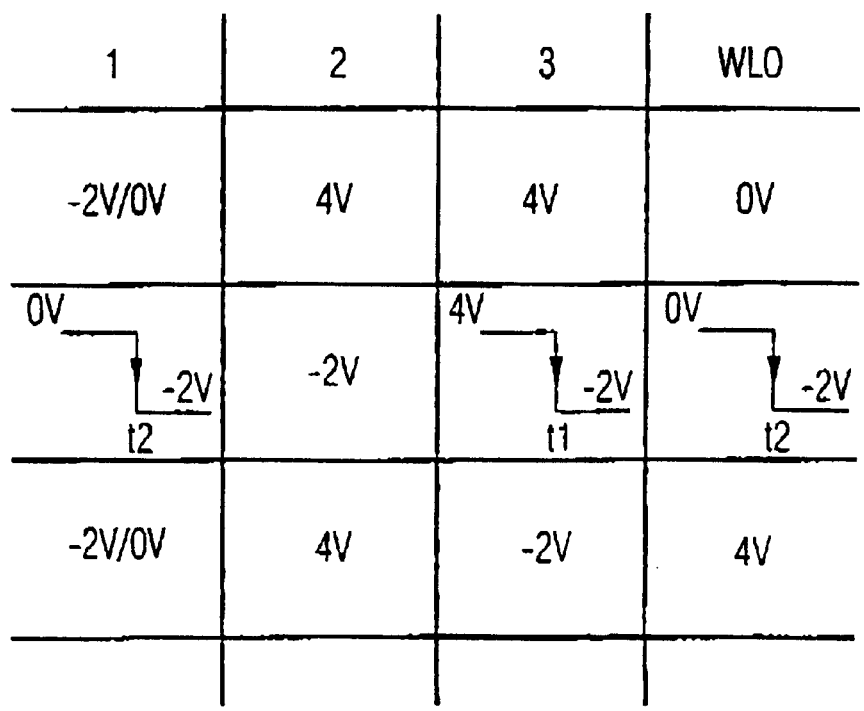
FIG. 3 is a chart showing the dependence of potentials at the output of the decoder elements on potentials of input signals.

FIG. 3 shows that three different potentials, namely 0 volts, −2 volts and 4 volts are generated at the output WL0 of the decoder element DE in FIG. 1 as a function of potentials at the terminals 1, 2, 3. In order to generate a potential of 0 volts at the output WL0, 4 volts is present at the second terminal and at the third terminal, and −2 volts or 0 volts is present at the first terminal. The third transistor T3 is then switched off and the fourth transistor T4 is switched on, with the result that the output WL0 is conductively connected to ground through the fourth transistor T4. Because the ground potential is present at the gate of the second transistor T2, the second transistor T2 is switched off. The 4 volts at the second terminal 2 also switches off the fifth transistor T5, and switches the sixth transistor T6 on so that the ground voltage is present via the latter at the gate of the first transistor T1. Because the potential at the first terminal 1 is less than or equal to the gate potential of the first transistor T1, it also switches off.

In order to generate a potential of −2 volts at the output WL0, the decoder element DE in FIG. 1 is placed in an output state in which 0 volts is present at the first terminal 1, −2 volts is present at the second terminal 2 and 4 volts is present at the third terminal 3. It is favorable if 0 volts is already present at the first terminal 1, 4 volts is already present at the second terminal 2, and 4 volts is already present at the third terminal 3, with the result that a potential of 0 volts is generated at the output WL0 (see the first line of the table in FIG. 3). The potential at the second terminal 2 is then changed from 4 volts to −2 volts, the potential of 0 volts is first maintained at the output WL0 because the third transistor T3 continues to be switched off, and the fourth transistor T4 continues to be switched on. The −2 volts at the second terminal has the effect of switching off the sixth transistor T6 and causing the fifth transistor T5 to connect the 4 volts at the third terminal to the gate of the first transistor T1. As a result, the first transistor T1, continues to be switched off.

At a first time t1, the potential of the third terminal 3 has a negative edge from 4 volts to −2 volts. As a result, the fourth transistor T4 is switched off, with the result that the output WL0 is disconnected from ground. The third transistor T3 remains switched off because its gate-source voltage is 0V. Because the fifth transistor T5 remains switched on during the trailing edge of the potential at the third terminal 3, the gate potential of the first transistor T1 drops with the potential at the third terminal 3. The fifth transistor T5 is not switched off until its gate-source voltage is less than its threshold voltage. In the present case, the threshold voltage of the fifth transistor T5 is 0.7 volts. The gate potential of the first transistor T1 thus drops as a result of the negative edge of the potential at the third terminal 3 to −2 volts+0.7 volts=−1.3 volts before the fifth transistor T5 switches off.

At a second time t2 after the first time t1, the potential at the first terminal 1 has a negative edge of 0 volts to −2 volts. Because, at this time, both the fifth transistor T5 and the sixth transistor T6 are switched off, the gate potential of the first transistor T1 continues to drop owing to a boot strap effect which now takes place with the potential at the first terminal 1. In this way, the gate potential of the first transistor T1 reaches a value of approximately −1.3 volts−2 volts=−3.3 volts up to a time at which the negative edge of the potential at the first terminal 1 ends. In FIG. 3 the trailing edges are shown with infinite steepness. In reality they have a finite steepness with the result that a gradual change in potential takes place. As soon as a potential is present at the gate of the first transistor T1 which is less than the potential at the first terminal by an amount equal to at least the threshold voltage of this transistor, the first transistor T1 switches on, with the result that the potentials at its drain and its source correspond. For this reason, the potential at the output WL0 also has, simultaneously with the trailing edge of the potential at the first terminal 1, a trailing edge from 0 volts to −2 volts. The second transistor T2 namely connects the negative potential at the drain of the first transistor T1 in a conductive fashion to the output WL0 because ground is present at its gate. The trailing edge at the output WL0 also begins virtually at the second time t2.

In order, finally, to generate the third potential of 4 volts at the output WL0, either −2 volts or 0 volts is present at the first terminal 1, 4 volts is present at the second terminal, and −2 volts is present at the third terminal 3 (see the last line in the table in FIG. 3). The 4 volts at the second terminal 3 ensure that the fifth transistor T5 switches off, and the sixth transistor T6 connects the gate of the first transistor T1 to ground. The first transistor T1 is thus reliably switched off. The −2 volts at the third terminal 3 causes the fourth transistor T4 to be switched off and the third transistor T3 to be switched on. The 4 volts of the second terminal 2 are thus present at the output WL0.

FIG. 2 shows a decoder configuration which has, in each case, two of the decoder circuits DS, each of which has two decoder elements DE of the type illustrated in FIG. 1. A common, first signal R0 is fed to the first terminal 1 of the respective upper decoder element DE of the decoder circuits DS in FIG. 2. A common second signal DRV0 is fed to the second terminal 2 of the respective upper decoder element DE of the decoder circuits DS in FIG. 2. A common first signal R1 is fed to the first terminal 1 of the lower decoder elements DE of the decoder circuits DS, and a common, second signal DRV1 is fed to the second terminal 2 of the lower decoder elements DE of the decoder circuits DS. The third terminals 3 of each decoder circuit DS are connected to one another. One separate, third signal DEC0, DEC1 per decoder circuit DS is fed to the third terminals 3. The first signals R0, R1, the second signals DRV0, DRV1 and the third signals DEC0, DEC1 of the decoder circuits DS have, in order to generate the desired output potential at the outputs Wli, the potentials or potential profiles illustrated in FIG. 3.

It is clear that the decoder configuration in FIG. 2 can be expanded without difficulty with further decoder circuits DS, just one separate, third signal DECi being necessary per decoder circuit. In this way, a decoder configuration with any desired number of outputs WLi is obtained. If 4 volts is permanently present at the third terminal of one of the decoder circuits DS, this decoder circuit is deactivated, with the result that 0 volts is continuously present at its outputs Wli. If, on the other hand, the potential at the third terminal 3 of the decoder circuit DS has a negative edge of 4 volts to −2 volts, it is possible to determine at which of its outputs WLi −2 volts will be generated, and at which 4 volts will be generated, by the selection of the potential profiles at the first terminal 1 and at the second terminal 2.

The decoder configuration shown in FIG. 2 is suitable, for example, as a component of a word line decoder of an integrated memory in which the outputs WLi of the decoder elements DE are connected to one word line each, and the first signal R0, R1, the second signal DRV0, DRV1 and the third signal DEC0, DEC1 change their potentials as a function of word line addresses applied to the memory.

We claim:

1. A decoder element, comprising:

an output outputting an output signal having one of three different potentials including a first potential, a second potential, and a third potential, wherein the second potential lies between the first potential and the third potential;

a first terminal;

a potential terminal having a value of the second potential impressed thereon;

a first series circuit formed of a first transistor of a first conductivity type and a second transistor of a second conductivity type connected in series with each other and connected to said first terminal, said second transistor having a control terminal connected to said potential terminal, said first transistor having a control terminal, and said first terminal connected to said output through said first series circuit;

a second terminal;

a third transistor of said first conductivity type having a control terminal and connected between said second terminal and said output;

a fourth transistor of said second conductivity type connected between said output and said potential terminal and having a control terminal;

a third terminal connected to said control terminal of said third transistor and to said control terminal of said fourth transistor;

a fifth transistor of said first conductivity type having a control terminal, said fifth transistor connected to said control terminal of said first transistor and to said third terminal such that said third terminal is connected to said control terminal of said first transistor through said fifth transistor; and a sixth transistor of said second conductivity type having a control terminal, a first connection connected to said potential terminal, and a second connection connected to said control terminal of said first transistor such that said control terminal of said first transistor can be connected to said potential terminal through said sixth transistor, said second terminal connected to said control terminal of said fifth transistor and to said control terminal of said sixth transistor.

2. The decoder element according to claim 1, wherein, in order to generate the output signal having a value of the second potential, one of the first potential and the second potential is present at said first terminal, and the third potential is present at both said second terminal and said third terminal.

3. The decoder element according to claim 1, wherein, in order to generate the output signal having a value of the third potential, one of the first potential and the second potential is present at said first terminal, the third potential is present at said second terminal and the first potential is present at said third terminal.

4. A decoder circuit, comprising:

first and second decoder elements, each including:

an output outputting an output signal having one of three different potentials including a first potential, a second potential, and a third potential, wherein the second potential lies between the first potential and the third potential;

a first terminal;

a potential terminal having a value of the second potential impressed thereon;

a first series circuit formed of a first transistor of a first conductivity type and a second transistor of a second conductivity type connected in series with each other and connected to said first terminal, said second transistor having a control terminal connected to said potential terminal, said first transistor having a control terminal, and said first terminal connected to said output through said first series circuit;

a second terminal;

a third transistor of said first conductivity type having a control terminal and connected between said second terminal and said output;

a fourth transistor of said second conductivity type connected between said output and said potential terminal and having a control terminal;

a third terminal connected to said control terminal of said third transistor and to said control terminal of said fourth transistor;

a fifth transistor of said first conductivity type having a control terminal, said fifth transistor connected to said control terminal of said first transistor and to said third terminal such that said third terminal is connected to said control terminal of said first transistor through said fifth transistor; and a sixth transistor of said second conductivity type having a control terminal, a first connection connected to said potential terminal, and a second connection connected to said control terminal of said first transistor such that said control terminal of said first transistor can be connected to said potential terminal through said sixth transistor, said second terminal connected to said control terminal of said fifth transistor and to said control terminal of said sixth transistor; and said third terminal of said first decoder element connected to said third terminal of said second decoder element.

5. A method for operating decoder elements, which comprises the steps of:

providing a decoder element, containing:

an output outputting an output signal having one of three different potentials including a first potential, a second potential, and a third potential, the second potential lies between the first potential and the third potential;

a first terminal;

a potential terminal having a value of the second potential impressed thereon;

a first series circuit formed of a first transistor of a first conductivity type and a second transistor of a second conductivity type connected in series with each other and connected to the first terminal, the second transistor having a control terminal connected to the potential terminal, the first transistor having a control terminal, and the first terminal connected to the output through the first series circuit;

a second terminal;

a third transistor of the first conductivity type having a control terminal and connected between the second terminal and the output;

a fourth transistor of the second conductivity type connected between the output and the potential terminal and having a control terminal;

a third terminal connected to the control terminal of the third transistor and to the control terminal of the fourth transistor;

a fifth transistor of the first conductivity type having a control terminal, the fifth transistor connected to the control terminal of the first transistor and to the third terminal such that the third terminal is connected to the control terminal of the first transistor through the fifth transistor; and a sixth transistor of the second conductivity type having a control terminal, a first connection connected to the potential terminal, and a second connection connected to the control terminal of the first transistor such that the control terminal of the first transistor can be connected to the potential terminal through the sixth transistor, the second terminal connected to the control terminal of the fifth transistor and to the control terminal of the sixth transistor; and generating the output signal having the first potential by applying the first potential to the second terminal, then a change-over from the third potential to the first potential is impressed on the third terminal, and subsequently a change-over from the second potential to the first potential is impressed on the first terminal.

* * * * *